(12) United States Patent
Pulskamp

(10) Patent No.: US 7,420,318 B1
(45) Date of Patent: Sep. 2, 2008

(54) LATERAL PIEZOELECTRIC MICROELECTROMECHANICAL SYSTEM (MEMS) ACTUATION AND SENSING DEVICE

(75) Inventor: Jeffrey S. Pulskamp, Mclean, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 65 days.

(21) Appl. No.: 11/387,078

(22) Filed: Mar. 20, 2006

(51) Int. Cl.
*H03H 9/00* (2006.01)
(52) U.S. Cl. .................. 310/328; 310/316.01; 310/311
(58) Field of Classification Search ................. 310/311, 310/316.01, 332; 347/71, 72; 367/160, 161, 367/162
See application file for complete search history.

(56) References Cited

U.S. PATENT DOCUMENTS

| | | | |
|---|---|---|---|
| 6,327,855 B1 | 12/2001 | Hill et al. | |
| 6,501,625 B1 | 12/2002 | Boismier et al. | |
| 6,650,806 B2 * | 11/2003 | Rodgers et al. | 385/18 |
| 6,680,826 B2 | 1/2004 | Shiraishi et al. | |
| 6,748,177 B1 * | 6/2004 | Upton | 398/129 |
| 6,757,124 B2 | 6/2004 | Kelemen | |
| 6,760,194 B2 * | 7/2004 | Shiraishi et al. | 360/244.2 |
| 2001/0033121 A1 * | 10/2001 | Nguyen | 310/316.01 |
| 2003/0127944 A1 * | 7/2003 | Clark et al. | 310/316.01 |

OTHER PUBLICATIONS

Klaasse et al., "Piezoelectric Versus Electrostatic Actuation for a Capacitive RF-MEMS Switch," Proceedings of Semiconductor Sensor and Actuator Technology (SeSens), Nov. 29, 2002, Veldhoven, the Netherlands, pp. 631-634.
Ervin et al., "Recurve Piezoelectric-Strain-Amplifying Actuator Architecture," IEEE/ASME Transactions on Mechatronics, vol. 3, No. 4, Dec. 1998, pp. 293-301.

* cited by examiner

*Primary Examiner*—Thomas M. Dougherty
*Assistant Examiner*—Bryan P Gordon
(74) *Attorney, Agent, or Firm*—Edward L. Stolarum; A. David Spevack

(57) ABSTRACT

A microelectromechanical system (MEMS) device comprises a substrate; an anchored end connected to the substrate; a free end comprising an end effector opposite to the anchored end; a spring attached to the end effector; multiple actuation beams; multiple connection beams adapted to connect the multiple actuation beams to one another; and an actuator/sensor comprising a first electrode; a piezoelectric layer over the first electrode; and a set of second electrodes over the piezoelectric layer, wherein the set of second electrodes being defined by a transverse gap therebetween. Each of the multiple actuation beams comprises two sets of the second electrodes. The set of second electrodes comprise an extensional electrode and a contraction electrode. One of the sets of second electrodes is actuated asymmetrically with respect to a first plane resulting in a piezoelectrically induced bending moment arm in a lateral direction that lies in a second plane.

22 Claims, 18 Drawing Sheets

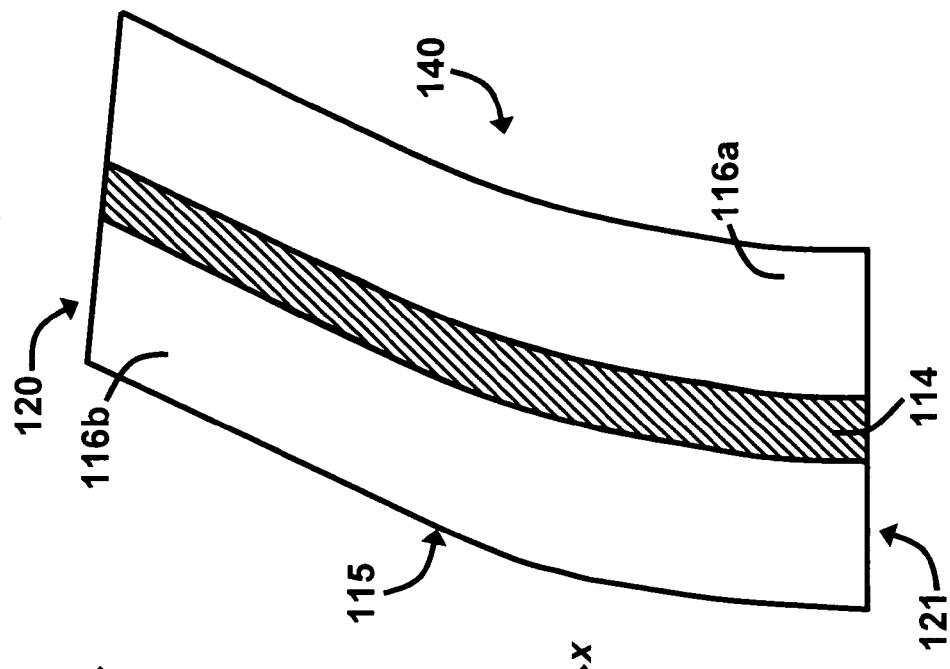
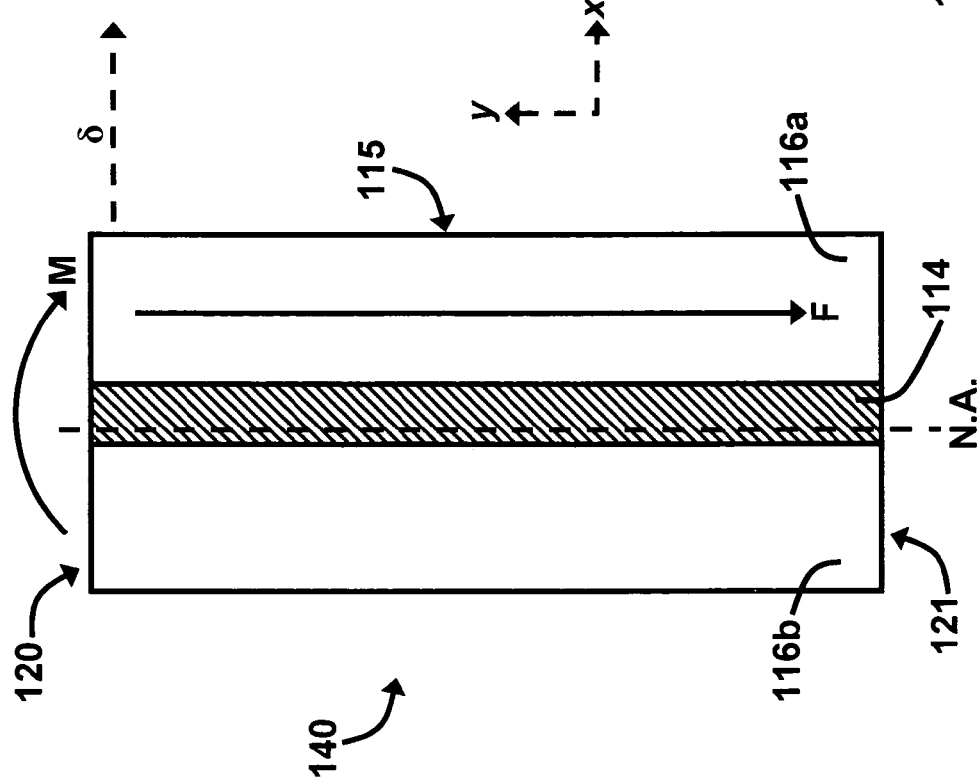

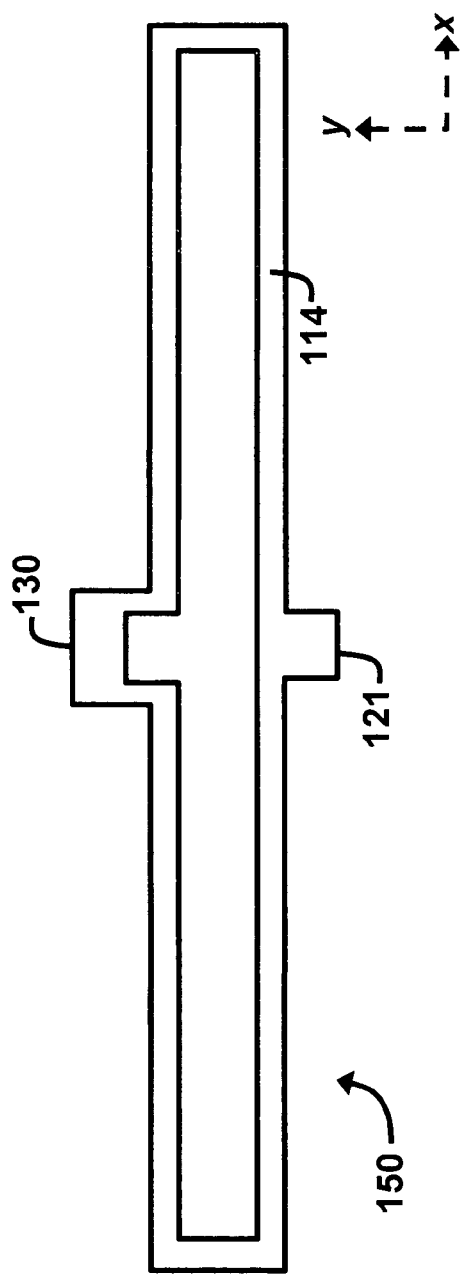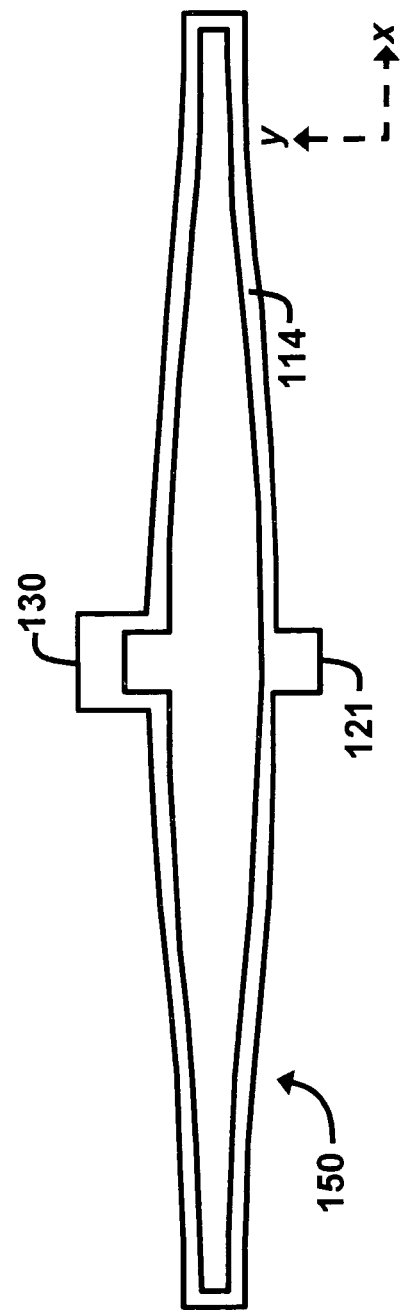

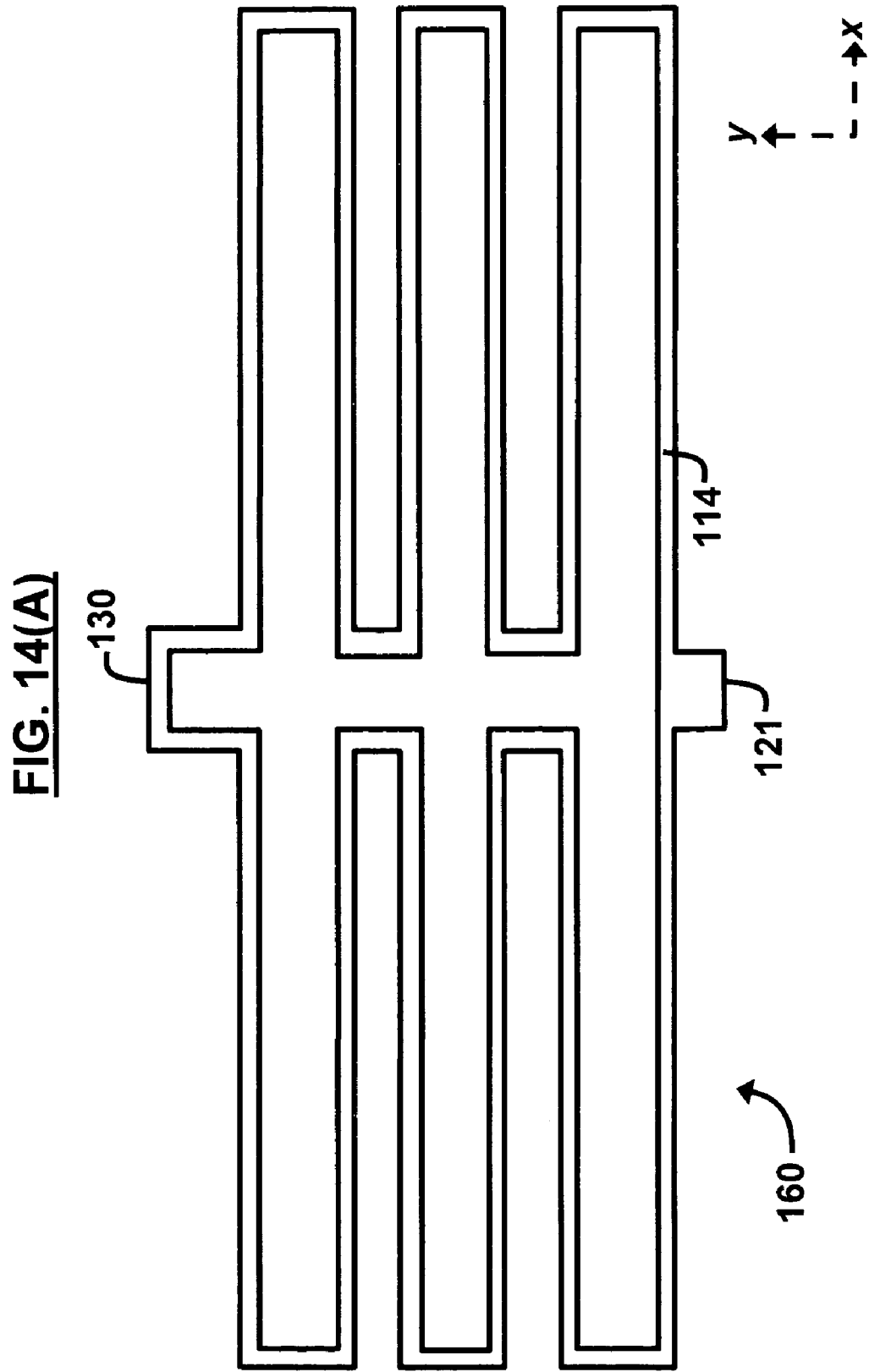

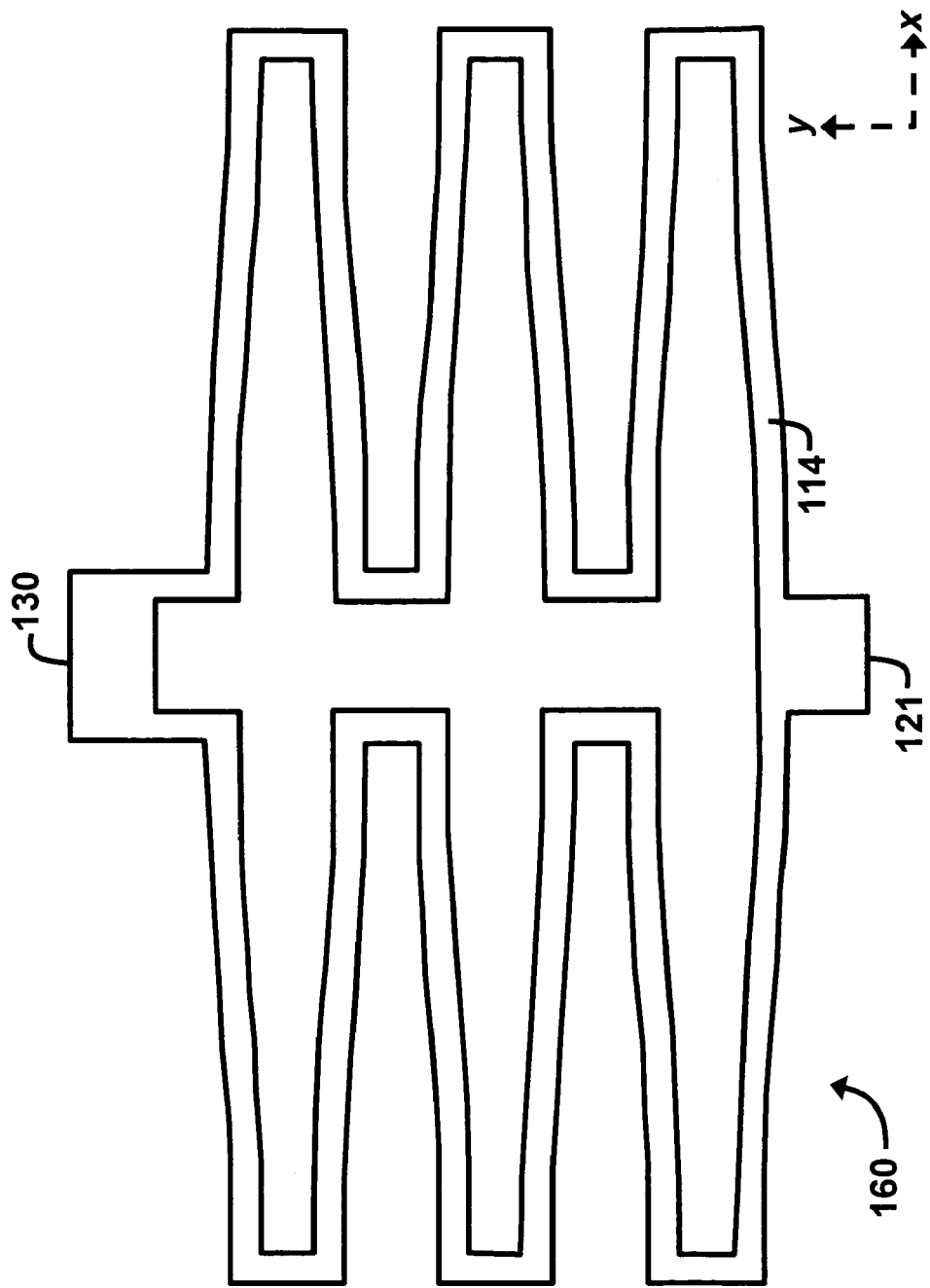

LATERAL PIEZOELECTRIC MICROELECTROMECHANICAL SYSTEM (MEMS) ACTUATION AND SENSING DEVICE

GOVERNMENT INTEREST

The embodiments of the invention described herein may be manufactured, used, and/or licensed by or for the United States Government.

BACKGROUND OF THE INVENTION

1. Field of the Invention

The embodiments of the invention generally relate to microelectronic systems, and more particularly to microelectromechanical systems (MEMS) and MEMS actuation and sensing technology.

2. Description of the Related Art

MEMS devices are micro-dimensioned machines manufactured by typical integrated circuit (IC) fabrication techniques. The relatively small size of MEMS devices allows for the production of high speed, low power, and high reliability mechanisms. The fabrication techniques also allow for low cost mass production. MEMS devices typically include both electrical and mechanical components, but may also contain optical, chemical, and biomedical elements.

There are a number of actuation and sensing technologies utilized in MEMS; the most common are electrostatic, electrothermal, magnetic, piezoelectric, piezoresistive, and shape memory alloy technologies. Of these, electrostatic MEMS are by far the most common due to their simplicity of fabrication and inherent electromechanical capabilities. However, piezoelectric MEMS out-perform electrostatic MEMS actuators in out-of-plane (vertical) displacements in terms of attainable range, power consumption, and voltage level. Typical electrostatic out-of-plane actuators, parallel plate electrostatic actuators, generally attain vertical displacements on the order of a few microns for several tens of volts while consuming microwatts of power. Piezoelectric out-of-plane unimorph actuators, as depicted in FIGS. 1 through 3, have shown greater than one hundred microns of vertical displacement for five volts and consuming tens of nanowatts of power within an equivalent device area. However, currently, piezoelectric MEMS are limited to out-of-plane motion while electrostatic MEMS excels at in-plane actuation.

The most basic piezoelectric actuator/sensor example is that of the unimorph, a composite piezoelectric cantilever beam. FIGS. 1 through 3 illustrate such a cantilever structure 5 having a supporting beam 10 with a bottom electrode 12, piezoelectric layer 14, and top electrode 16 formed successively over the supporting beam 10, and mechanically fixed at an anchored end 18 opposite a free end 20 of the cantilever structure 5.

In most conventional piezoelectric MEMS actuators, such as the cantilever structure 5 illustrated in FIGS. 1 through 3, out-of-plane bending (plane of bending is the x-z plane) is accomplished by building structures that are asymmetric about the x-y midplane of the piezoelectric layer 14, where the x-axis corresponds to the longitudinal direction, the y-axis corresponds to the width direction, the z-axis corresponds to the thickness (height) direction, and the origin of the coordinate system is located at the center of the clamped end of the cantilever structure 5. The supporting beam 10 acts as an additional structural layer that offsets (by distance δ) the neutral axis (N.A.$_1$) of the supporting beam 10 from the geometric mid-plane of the piezoelectric layer 14 to a neutral axis (N.A.$_2$) located beneath the piezoelectric layer 14. When a voltage is applied between the bottom and top electrodes 12, 16, respectively, a piezoelectrically generated strain induced axial force acts on the cantilever structure 5. The effective line of action of this force lies in the geometric mid-plane neutral axis (N.A.$_1$) of the piezoelectric layer 14. When this axial force acts at some perpendicular distance, δ, (moment arm) from the neutral axis (N.A.$_1$) of the piezoelectric layer 14, a bending moment (M) is created. This bending moment (M) causes the cantilever structure 5 to bend in the x-z plane. The converse effect is true for the structure to function as a sensor. An applied stress, causing bending, will cause the piezoelectric material to generate a voltage which may be detected with additional electronics.

With a top electrode 16 that is symmetric about the x-z-plane, the conventional cantilever structure 5 results in a moment arm (δ) that lies in the x-z plane, as shown in FIG. 3. The induced bending thus occurs in an x-z plane (i.e., out-of-plane). However, such a structure does not facilitate in-plane bending. Clearly, the ability to have a structure capable of both in-plane and out-of-plane motion would be advantageous.

As described in "Recurve Piezoelectric-Strain-Amplifying-Actuator Architecture,";IEEE/ASME Transactions on Mechatronics, Vol. 3, No. 4, 293-301, December 1998, the complete disclosure of which, in its entirety, is herein incorporated by reference, Ervin and Brei have designed macro-scale (non-MEMS) piezoelectric actuators that utilize what they term "piezoelectric recurve" actuators. These structures generate two distinct equal and opposite piezoelectric bending moments within each basic recurve beam, each affecting its respective half of the beam, that cause the translation of the free end of the actuator. These basic actuators may be connected to provide amplified actuation. However, this conventional design generally cannot be implemented at the MEMS scale without modifications to account for the MEMS specific problems of residual stress deformation and thin film piezoelectric electroding requirements.

Mechanical mechanisms require spatial degrees of freedom for motion. There are six primary degrees of freedom including three translational and three rotational along and about each of the three principle dimensions x, y, and z. The present state of piezoelectric MEMS actuation generally possesses only one of these translational degrees of freedom. Electrostatic MEMS however, the most commonly employed MEMS technology, possesses all three translational degrees of freedom. As a result, there is a much wider array of possible mechanisms and devices that may be constructed with electrostatic MEMS actuators. Electrostatic parallel plate actuators achieve both out-of-plane and in-plane actuation and "combdrive" actuators are commonly used for large in-plane displacements. As such, the lack of piezoelectric actuators with additional spatial degrees of freedom has limited the scope of possible piezoelectric MEMS devices to date. Therefore, there is a need for a novel piezoelectric MEMS actuator/sensor device in which actuated/sensed translation specifically occurs in a lateral (in-plane) direction.

SUMMARY OF THE INVENTION

In view of the foregoing, an embodiment of the invention provides a microelectromechanical system (MEMS) device comprising a silicon substrate; an actuator comprising a first electrode; a piezoelectric layer over the first electrode; and a set of second electrodes over the piezoelectric layer, the set of second electrodes being defined by a transverse gap therebetween. The device further comprises an anchored end connected to the substrate and a free end comprising an end effector opposite to the anchored end. The device further comprises multiple actuation beams and multiple connection beams adapted to connect multiple actuation beams to one another. The connection beams are of the same composition as the actuation beams with the exception of having the top electrode symmetric about the center line of the connection beam. It therefore does not contribute a bending moment.

The connection beams provide both mechanical and electrical connection between the actuation beams and, although are piezoelectrically active, do not contribute to the deformation of the device. The actuation beams comprise two sets of the second electrodes. Moreover, the sets of second electrodes comprise an extensional electrode and a contraction electrode. Only one of the two sets of second electrodes is electrically active when the device is in use. The other set of second electrodes serves to provide a mechanically beneficial symmetry to the system that allows for greater actuation sensitivity. Without this symmetry, the generated moment arm ($\delta$) would partially reside out of the intended plane of bending (x-y); diminishing the effective in-plane actuation. Furthermore, the end effector is attached to residual stress deformation mitigation springs, which are adapted to prevent out-of-plane stress deformation of the actuator and to restrict the translational motion of the end effector to be uniaxial within the x-y plane.

The embodiments of the invention allow for piezoelectric actuation and sensing that utilizes two additional translational degrees of freedom by permitting motion in the x-y plane. This capacity permits the developments of entirely new classes of piezoelectric MEMS devices. The various actuator devices provided by the several embodiments of the invention function such that one of the sets of top electrodes are actuated asymmetrically with respect to the x-z plane (the origin is located at the center of the beam). For a structure that is symmetric about the midplane of the piezoelectric layer, this results in a piezoelectrically induced bending moment arm ($\delta$) that lies in the x-y plane. The induced bending thus occurs in the x-y plane (i.e. the lateral direction). The embodiments of the invention effectively rotate the piezoelectric moment arm ($\delta$) from the standard case, residing in the x-z plane, into the x-y plane; thus changing the plane of bending. The x-z plane may be thought of as a first plane transverse to the x-y plane (second plane).

The applications for the embodiments of the invention are such that they could perform any function currently performed by lateral electrostatic MEMS actuators, the present standard, at significantly smaller sizes, power consumption, actuation voltages, and larger displacement ranges. The devices provided by the embodiments of the invention permit extremely large displacements, on the order of hundreds to thousands of microns, at very low voltages. Some general applications afforded by the embodiments of the invention include radio frequency (RF) MEMS circuits, optical switching networks, safety and arming applications, and may be an enabling technology for high performance micro-robotics. This class of devices may potentially revolutionize MEMS technology, displacing electrostatic MEMS as the dominant and most flexible MEMS technology.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 5 is a top view of the cantilevered structure of FIG. 4 according to a first embodiment of the invention;

FIG. 6 is a top view of the cantilevered structure of FIG. 4 undergoing in-plane extensional deflection according to a first embodiment of the invention;

FIG. 11(A) is a top cross-sectional view of the piezoelectric MEMS actuator/sensor device of FIGS. 7 and 8 according to a second embodiment of the invention;

FIG. 11(B) is a top cross-sectional view of the piezoelectric MEMS actuator/sensor device of FIGS. 7 and 8 undergoing extensional actuation according to a second embodiment of the invention;

FIG. 14(A) is a top cross-sectional view of the piezoelectric MEMS actuator/sensor device of FIGS. 12 and 13 according to a third embodiment of the invention;

FIG. 14(B) is a top cross-sectional view of the piezoelectric MEMS actuator/sensor device of FIGS. 12 and 13 undergoing extensional actuation according to a third embodiment of the invention;

DETAILED DESCRIPTION OF PREFERRED EMBODIMENTS OF THE INVENTION

Figure 1:
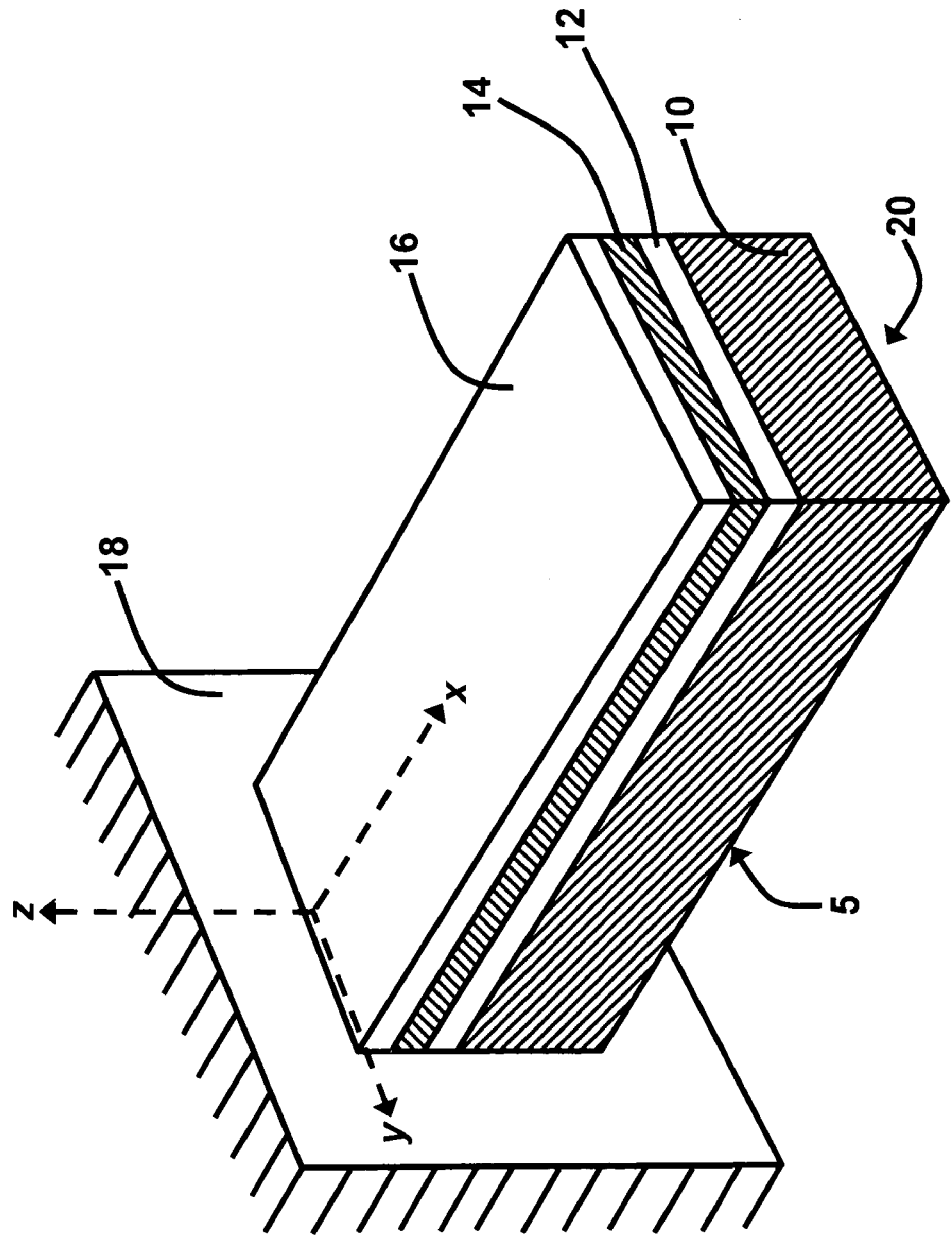
FIG. 1 is a perspective view of a conventional cantilevered structure of a piezoelectric MEMS actuator device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there is a need for a novel piezoelectric MEMS actuator/sensor device in which induced/sensed bending of the MEMS structure occurs in a lateral (in-plane) direction. Referring now to the drawings and more particularly to FIGS. 4 through 18 where similar reference characters denote corresponding features consistently throughout the figures, there are shown preferred embodiments of the invention.

Figure 2:
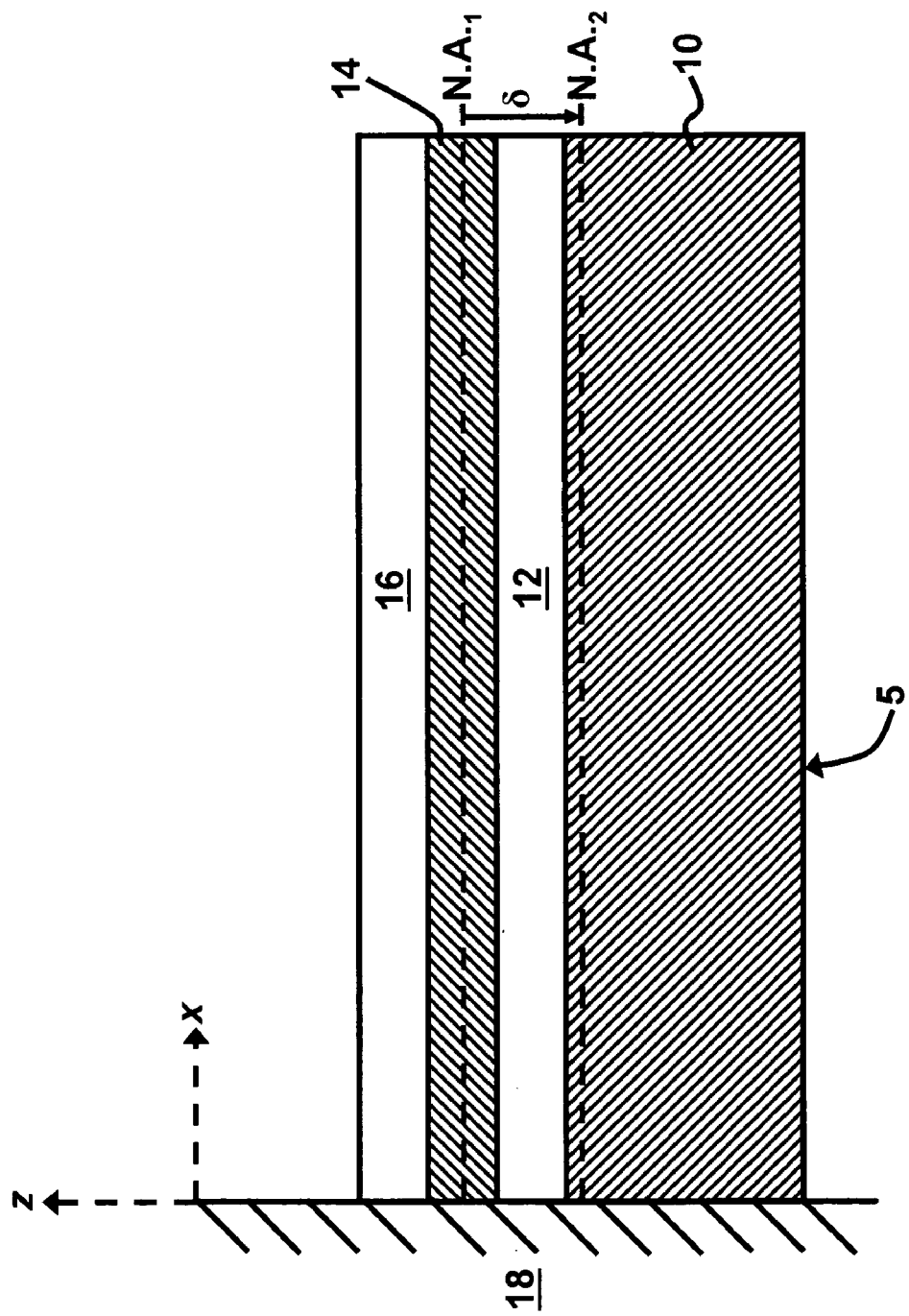
FIG. 2 is a front view of the conventional cantilevered structure of FIG. 1.
Figure 3:
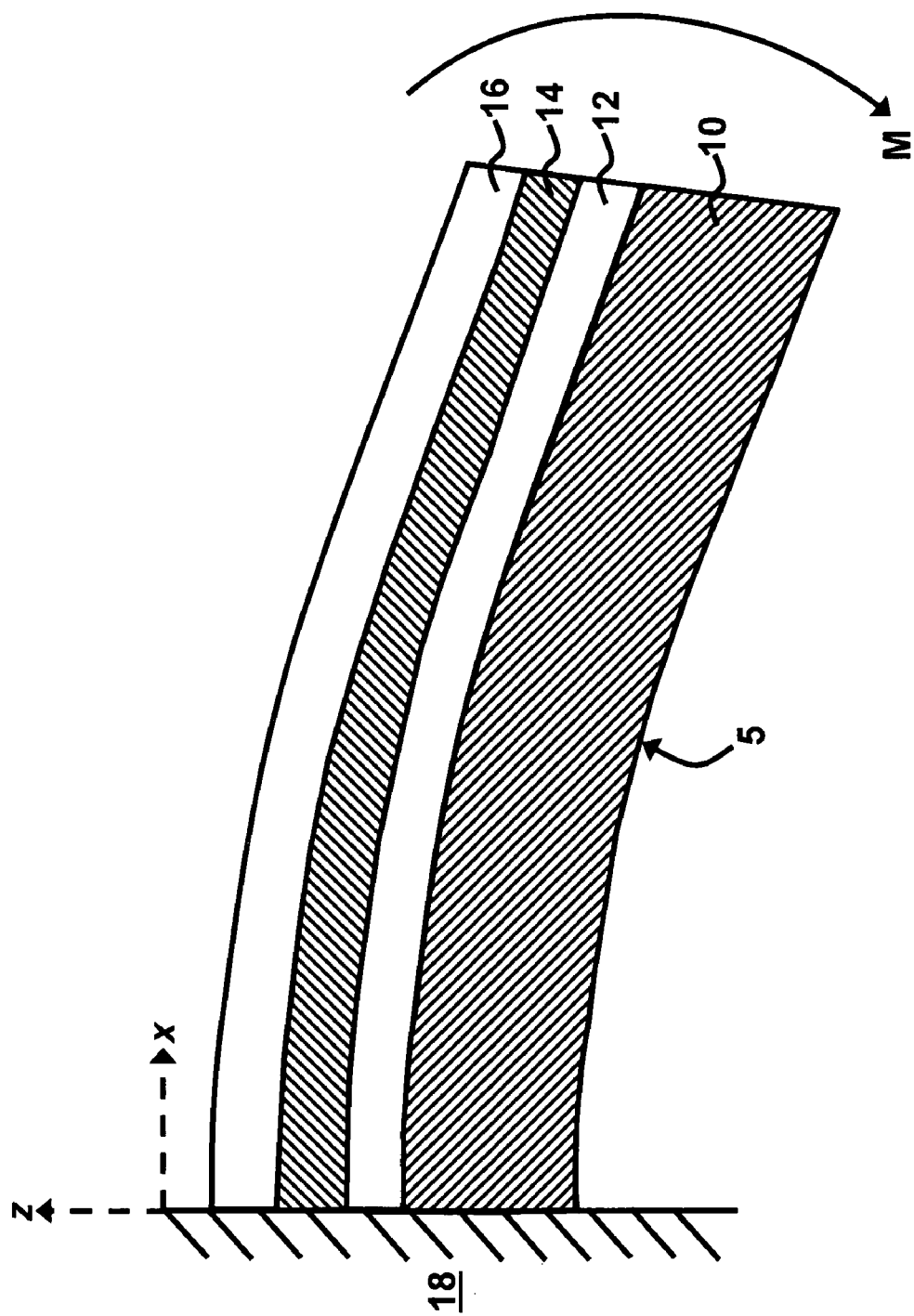
FIG. 3 is a front view of the conventional cantilevered structured of FIG. 1 undergoing bending.
Figure 4:
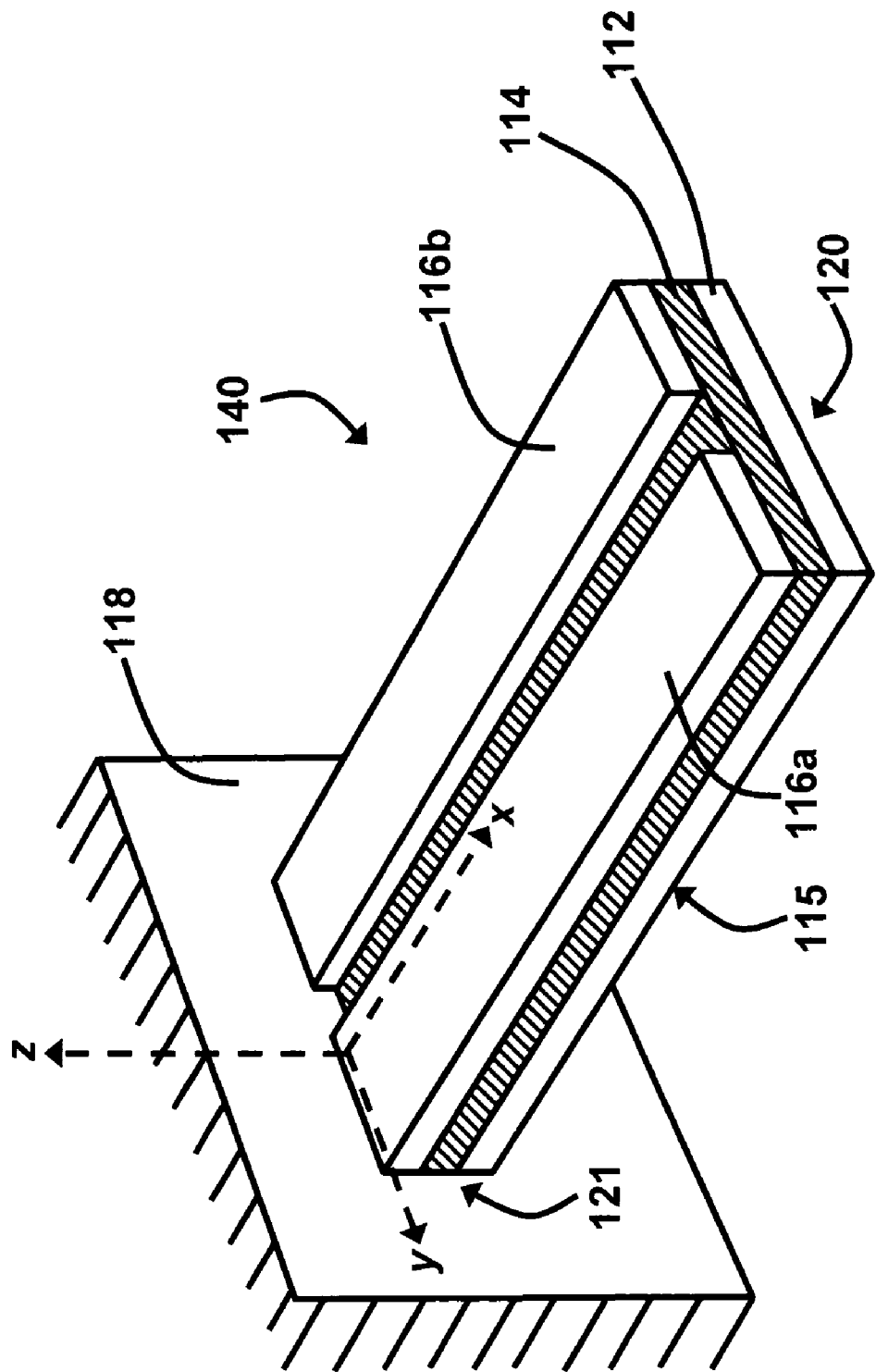
FIG. 4 is a perspective view of a cantilevered structure of a piezoelectric MEMS actuator/sensor device according to a first embodiment of the invention.

There are multiple geometric configurations possible for the piezoelectric actuator/sensor according to the embodiments of the invention. A first embodiment is illustrated as a cantilever beam 115 shown in FIGS. 4 through 6. FIG. 4 illustrates a piezoelectric actuator/sensor device 140 according to the first embodiment of the invention. The actuator/sensor device 140 comprises a pair of upper electrodes 116a, 116b, which may comprise platinum or other suitable material, disposed over an active piezoelectric layer 114, which is positioned above a lower electrode 112. The piezoelectric layer 114 preferably comprises sol-gel $PZ_{0.52}T_{0.48}$(PZT). The configuration of the actuator/sensor device 140 enables proper device operation by having the upper electrodes 116a, 116b and the lower electrode 112 sandwich the piezoelectric layer 114 and by using a pair of upper electrodes 116a, 116b. The absence of the traditional MEMS piezoelectric out-of-plane piezoelectric actuator's structural layer (as depicted in FIGS. 1 through 3) ensures the optimal condition of the piezoelectric moment arm (δ) residing in the x-y plane according to the embodiments of the invention. The actuator/sensor device 140 comprises a free end 120 and an anchored end 121 attached to a substrate 118.

FIG. 5 illustrates a top view of the actuator/sensor device 140 of FIG. 4. When a voltage is applied between the lower electrode 112 and one of the upper electrodes (shown here, for example, upper electrode 116a), a piezoelectrically generated strain induced axial force (F) offset from the neutral axis (N.A.) of the actuator/sensor device 140, creates a bending moment (M) on the actuator/sensor device 140, which is configured as a cantilever beam 115. This bending moment (M) causes in-plane deflection (x-y plane) of the actuator/sensor device 140 with the direction of the generated displacement shown as offset distance δ. FIG. 6 illustrates the actuator/sensor device 140 undergoing bending thereby producing lateral in-plane (x-y plane) deflection of the actuator/sensor device 140.

The configurations of the upper electrodes 116a, 116b are dependant upon actuator geometry. In the cantilever beam 115 illustrated in FIGS. 4 through 6 only one upper electrode 116a (for example) is actuated; otherwise if both upper electrodes 116a, 116b were actuated, the generated bending moments (M) would cancel and no lateral bending would occur.

Figure 7:
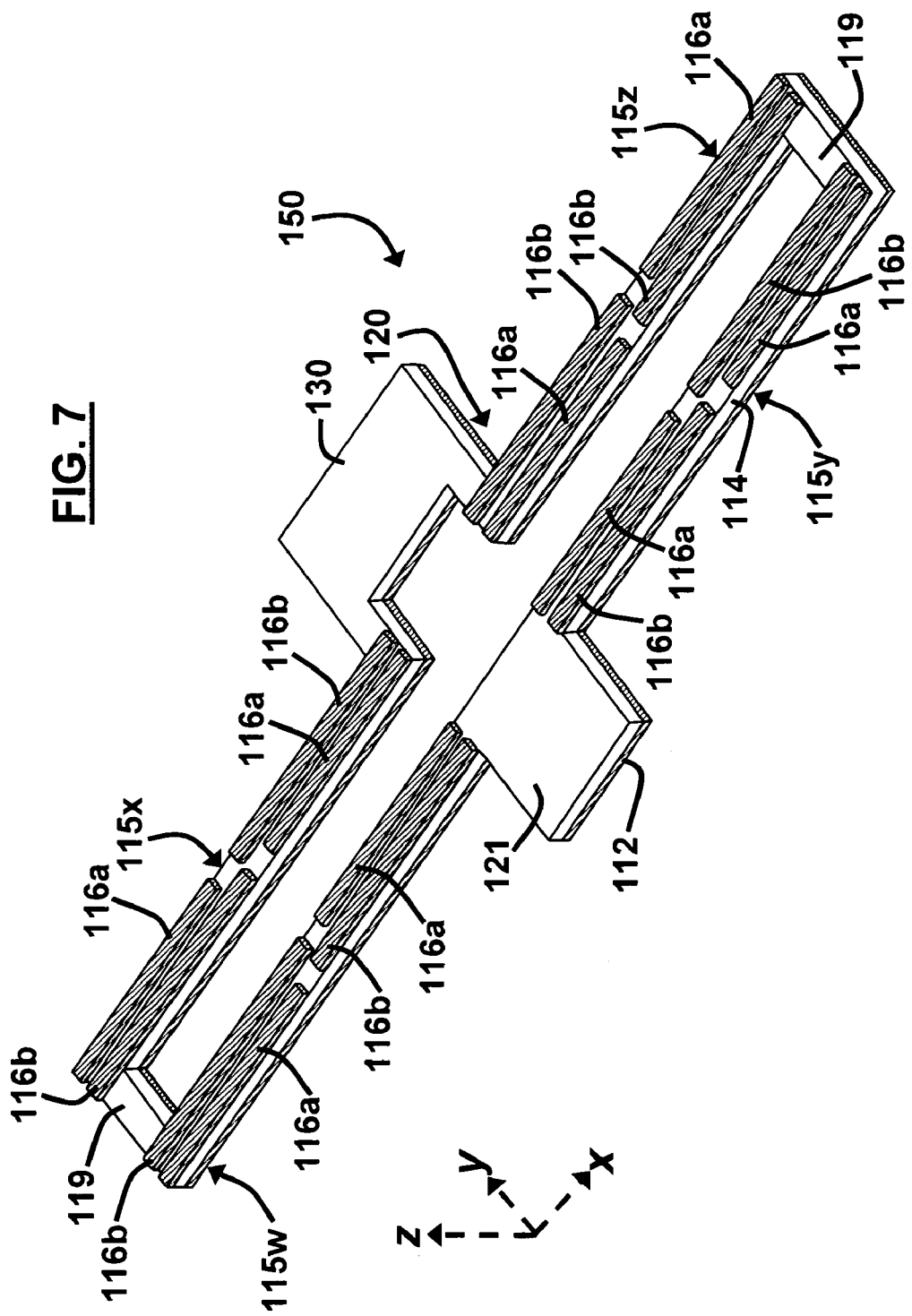
FIGS. 7 and 8 are top perspective views of a piezoelectric MEMS actuator/sensor device according to a second embodiment of the invention.
Figure 8:
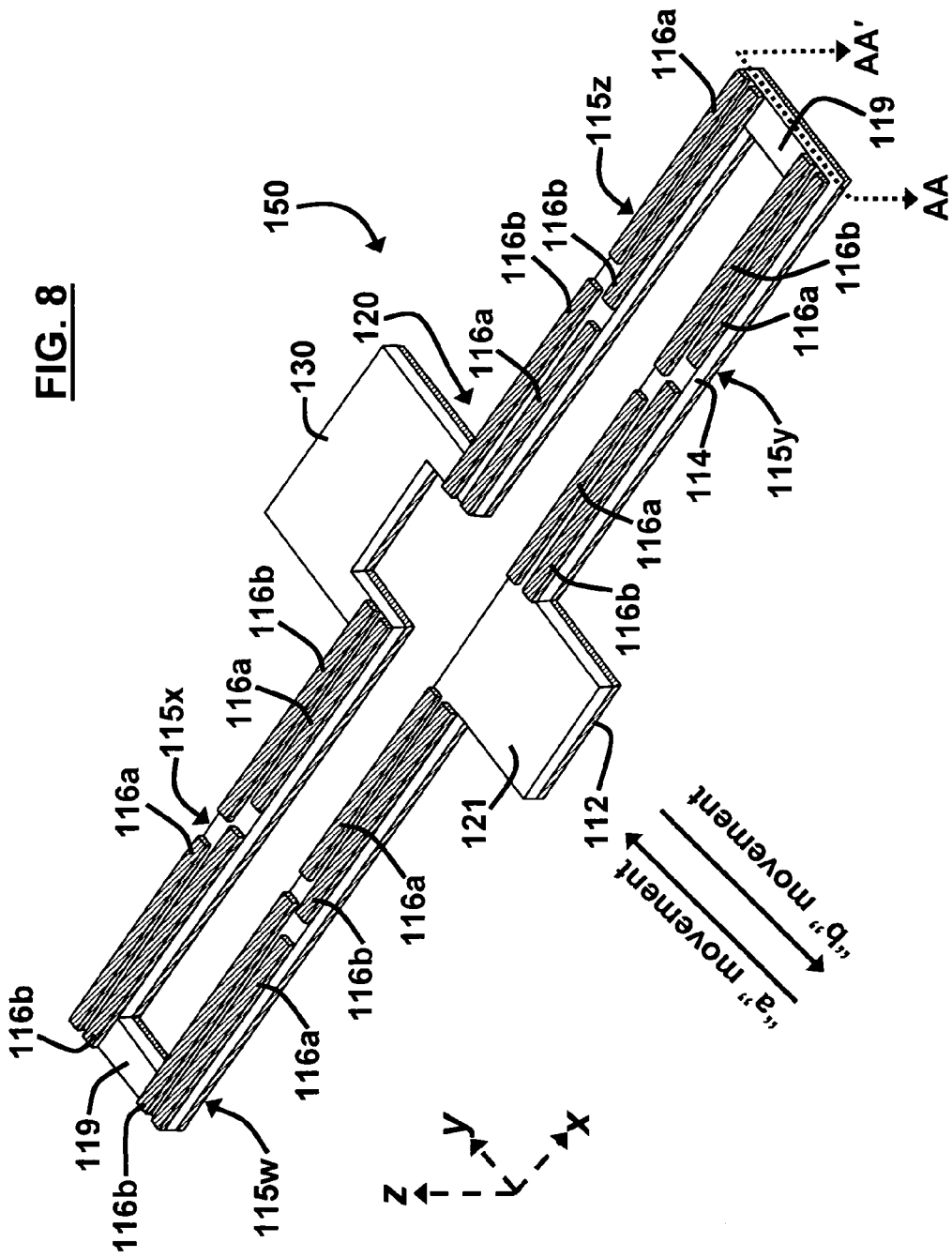

FIGS. 7 through 11(B) illustrate a piezoelectric MEMS actuator/sensor device 150 according to a second embodiment of the invention. An anchored end 121 of the actuator/sensor device 150 is attached to the substrate 118 (of FIG. 4) which fixes the actuator/sensor device 150 in place and an end effector 130 is positioned opposite the anchored end 121. The end effector 130 is positioned on the free end 120 of the piezoelectric MEMS actuator/sensor device 150. The displacement of the free end 120 largely remains in the x-y plane (plane of the substrate 118) upon actuation (i.e., application of voltage). FIG. 8 illustrates the general bidirectional actuation movement of the upper electrodes 116a, 116b where the "a" movement corresponds with the direction of movement of upper electrode 116a and the "b" movement corresponds with the direction of movement of upper electrode 116b. Generally, the actuation of upper electrode 116a results in contraction of the actuator/sensor device 150 and actuation of upper electrode 116b results in extension of the actuator/sensor device 150.

The actuation occurs similarly to the process described for the actuator/sensor device 140 of FIGS. 5 and 6, thus a voltage applied between the lower electrode 112 and one of the upper electrodes (shown here, for example, upper electrode 116a causes in-plane (x-y plane) deflection of the actuator/sensor device 150 with the direction of the generated displacement shown as "a" and "b" for the respective upper electrodes 116a, 116b. Likewise, the converse effect is true for the structure to function as a sensor. An applied stress, causing bending, will cause the piezoelectric material to generate a voltage which may be detected with additional electronics (not shown).

Generally, the actuator/sensor device 150 comprises multiple sets of preferably four parallel actuation beams 115w, 115x, 115y, 115z connected at their extreme ends by perpendicular connection beams 119. Electrode traces 113 (shown in FIGS. 9 and 10) also run along the connection beams 119 to electrically connect all actuation beams 115w, 115x, 155y, 115z (shown in FIGS. 7 and 8). Each set of four parallel actuation beams 115w, 115x, 115y, 115z may then be attached to the next set by additional connection beams 119 at the inner ends of the parallel actuation beams 115w, 115x, 115y, 115z. For the optimal configuration, the upper electrodes 116a, 116b on each parallel actuation beam 115w, 115x, 115y, 115z are separated in order to achieve maximum lateral deflection. The end effector 130 is located at the connection point of the last set of parallel actuation beams 115x, 115z.

Figure 9:
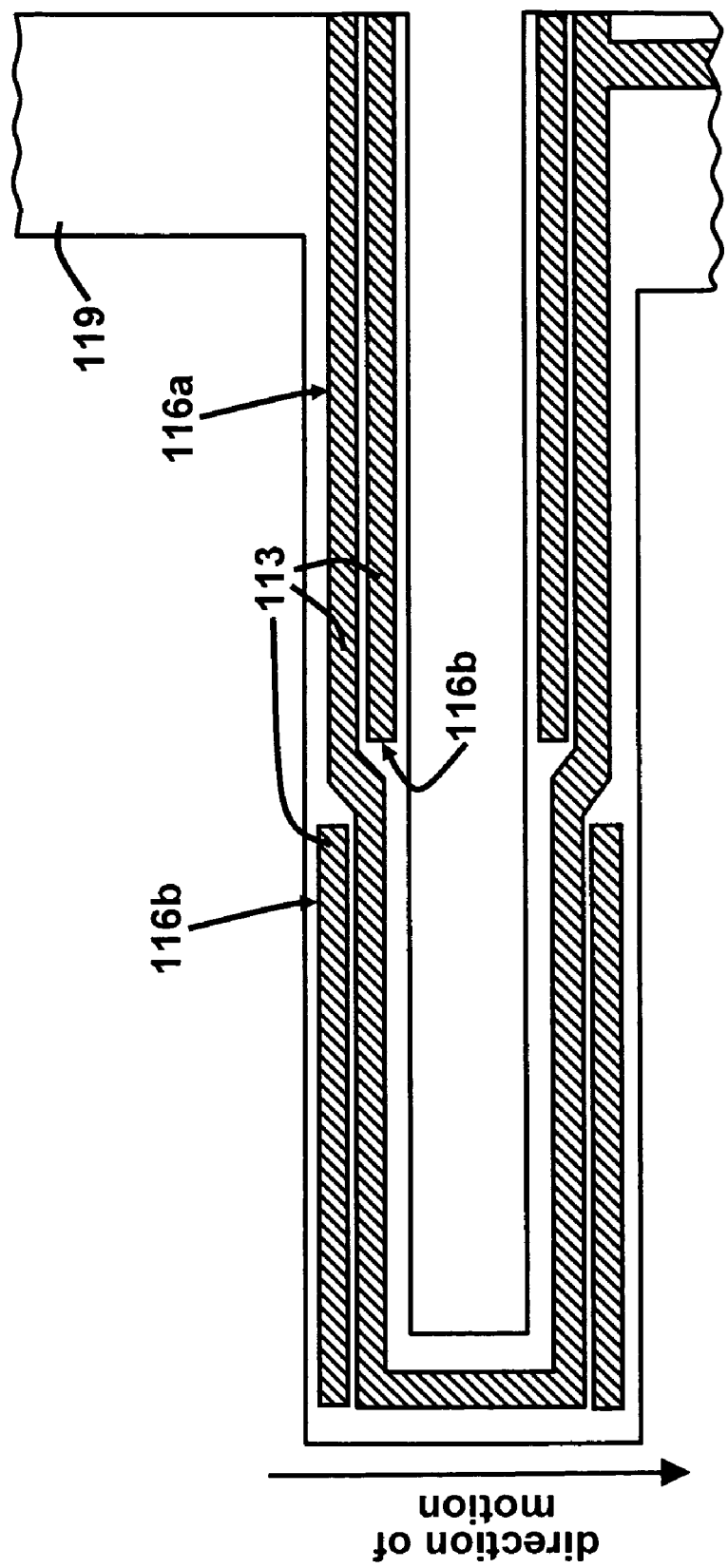
FIG. 9 is a top view of a top electrode configuration utilized for contraction of a piezoelectric MEMS actuator/sensor according to a second embodiment of the invention.
Figure 10:
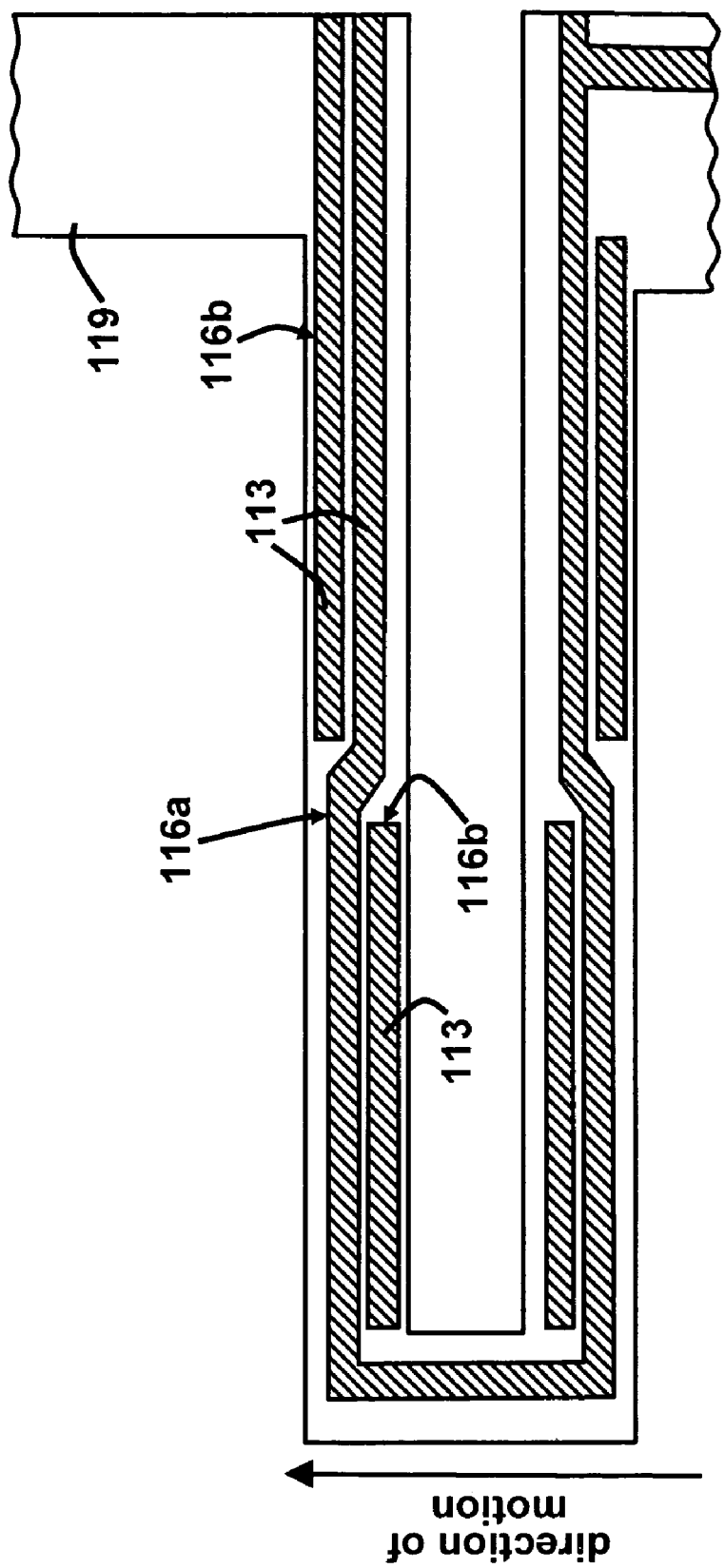
FIG. 10 is a top view of a top electrode configuration utilized for extension of a piezoelectric MEMS actuator/sensor according to a second embodiment of the invention.

In one configuration, the upper electrodes 116a, 116b on each of the actuation beams 115w, 115x, 115y, 115z may be separated into three sections as depicted in FIGS. 9 and 10. FIG. 9 illustrates the upper electrode configuration for a contraction actuation device while FIG. 10 illustrates the upper electrode configuration for an extensional actuation device. The upper electrodes 116a that are diagonal from one another are of the same set (to be at the same electrical potential). One set is used for extension of the end effector 130 (of FIG. 7) away from the anchored end 121 (of FIG. 7) and the other set of upper electrodes 116b is used for contraction of the end effector 130 toward the anchored end 121.

The sections of the active set of upper electrodes 116a are continuous so as to provide electrical connectivity. The other set of upper electrodes 116b, which are electrically inactive, serves to provide a mechanically beneficial symmetry to the system that allows for greater actuation sensitivity. The diagonal nature of the geometry is to provide deflection of one half of the actuation beams 115x, 115z that is the opposite of the other half of the actuation beams 115w, 115y, respectively. This creates an "S" like deflection profile of a single actuation beam (further illustrated in FIGS. 11(B) and 14(B)). This configuration reduces the reaction forces and moments at the connection beams 119 and serves to enhance the displacement of the total actuator/sensor device 150.

FIG. 11(A) illustrates a top view of the actuator/sensor device 150 cut along line AA-AA' of FIG. 8. Thus, in the view shown in FIG. 11(A), the piezoelectric layer 114 is shown exposed. FIG. 11(B) illustrates a top view of the actuator/sensor device 150 cut along line AA-AA' of FIG. 8 as it undergoes actuation thereby producing lateral in-plane (x-y plane) deflection of the actuator/sensor device 150. Thus, FIG. 11(B) illustrates the actuator/sensor device 150 undergoing extensional actuation with the use of upper electrodes 116a (the specific upper electrode configuration as depicted in FIG. 7). Again, in the view shown in FIG. 11(B), the piezoelectric layer 114 is shown exposed, thus the upper electrodes 116a, 116b are not shown in this view.

Figure 12:
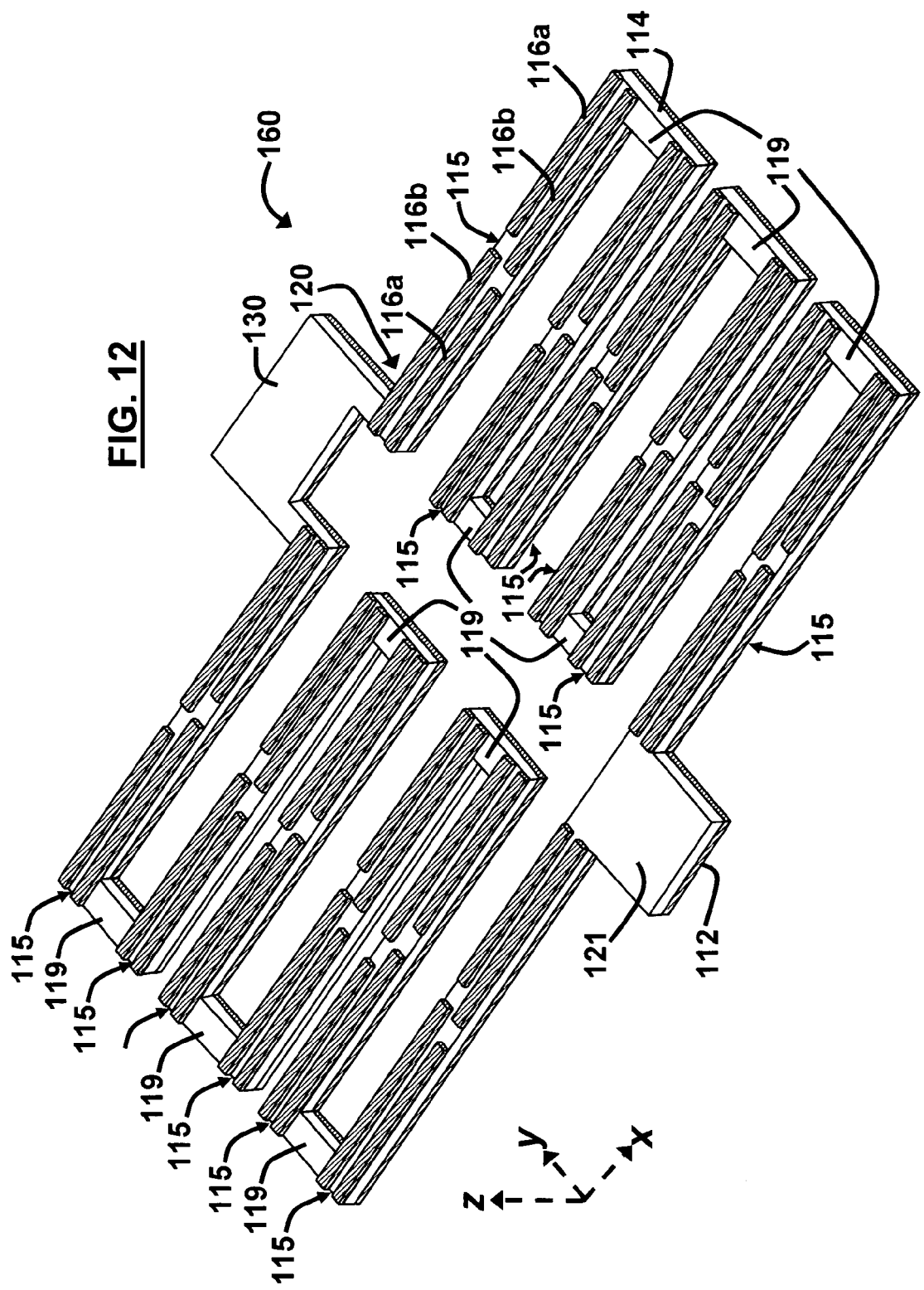
FIGS. 12 and 13 are top perspective views of a piezoelectric MEMS actuator/sensor device according to a third embodiment of the invention.
Figure 13:
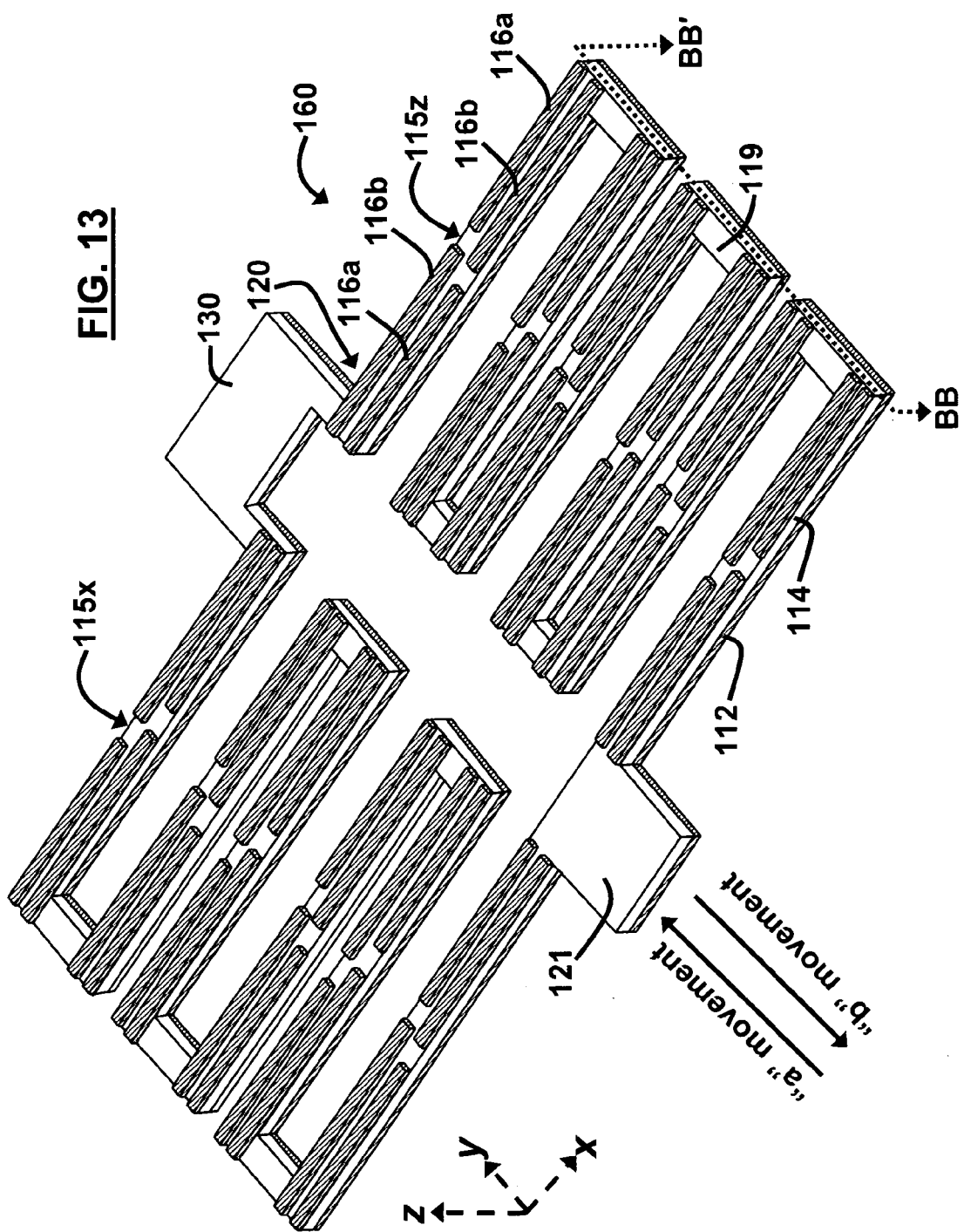

FIGS. 12 through 14(B) illustrate a piezoelectric MEMS actuator/sensor device 160 according to a third embodiment of the invention. As shown, n additional cantilever (actuator) beams 115 provide n times the deflection. As illustrated in FIG. 12, the upper electrodes 116a, 116b are arranged in a similar pattern as in the second embodiment of FIGS. 7 through 11(B). The anchored end 121 is attached to a substrate 118 (i.e., the substrate 118 as shown in FIG. 4) which fixes the actuator/sensor device 160 in place and the end effector 130 is positioned opposite the anchored end 121. The end effector 130 is positioned on the free end 120 of the piezoelectric MEMS actuator/sensor device 160. The displacement of the free end 120 remains in the x-y plane (plane of the substrate 118) upon actuation (i.e., application of voltage). FIG. 13 illustrates the general bidirectional actuation movement of the upper electrodes 116a, 116b where the "a" movement corresponds with the direction of movement of upper electrode 116a and the "b" movement corresponds with the direction of movement of upper electrode 116b.

Generally, the actuation of upper electrode 116a results in extension of the actuator/sensor device 160 and actuation of upper electrode 116b results in contraction of the actuator/sensor device 160. The actuation occurs similarly to the process described for the actuator/sensor device 140 of FIGS. 5 and 6 and the actuator/sensor device 150 of FIGS. 7 through 11(B), thus a voltage applied between the lower electrode 112 and one of the upper electrodes (for example, upper electrode 116b), results in the deflection of the actuator/sensor device 160 with the direction of the generated displacement shown as "a" and "b" for the respective upper electrodes 116a, 116b. Likewise, the converse effect is true for the structure to function as a sensor. An applied stress, causing bending, will cause the piezoelectric material to generate a voltage which may be detected with additional electronics (not shown).

Generally, the actuator/sensor device 160 comprises multiple (n) sets of parallel actuation beams 115 connected at their extreme ends by perpendicular connection beams 119. Electrode traces 113 (similar to the ones shown in FIGS. 9 and 10) also run along the connection beams 119 to electrically connect all actuation beams 115. Each set of parallel actuation beams 115 are then attached to the next set by additional connection beams 119 at the inner ends of the parallel actuation beams 115. For the optimal configuration, the upper electrodes 116a, 116b on each parallel actuation beam 115 are configured as illustrated in FIGS. 9 and 10 in order to achieve maximum lateral deflection. The end effector 130 is located at the connection point of the last set of parallel actuation beams 115x, 115z (shown more particularly in FIG. 13).

FIG. 14(A) illustrates a top view of the actuator/sensor device 160 cut along line BB-BB' of FIG. 13. Thus, in the view shown in FIG. 14(A), the piezoelectric layer 114 is shown exposed. FIG. 14(B) illustrates a top view of the actuator/sensor device 160 cut along line BB-BB' of FIG. 13 as it undergoes actuation thereby producing lateral in-plane (x-y plane) deflection of the actuator/sensor device 160. Thus, FIG. 14(B) illustrates the actuator/sensor device 160 undergoing the extensional actuation with the electrode configuration depicted in FIG. 10. Again, in the view shown in FIG. 14(B), the piezoelectric layer 114 is shown exposed, thus the upper electrodes 116a, 116b are not shown in this view.

FIGS. 15 through 18 illustrate a piezoelectric MEMS actuator/sensor device 170 according to a fourth embodiment of the invention. As shown, n additional actuation beams 115 provide n times the deflection. The actuator/sensor device 170 comprises a spring member preferably embodied as residual stress deformation mitigation springs 180, which are configured to have a large out-of-plane stiffness (k), to resist residual stress deformation, and a large in-plane compliance that minimizes the influence of the springs 180 on the in-plane displacement of the actuator/sensor device 170. The springs 180, which may comprise single crystal silicon or other suitable material of minimal residual stress, are connected to the end effector 130 and are anchored (anchoring substrate not shown) at the ends 185 of the spring 180. Furthermore, there exist multiple possible geometric configurations for the springs 180. The various geometries are valid if they achieve large out-of-plane stiffness and large in-plane compliance such that they prevent out-of-plane stress deformation with minimal reduction of the in-plane displacement of the end effector 130.

Figure 15:
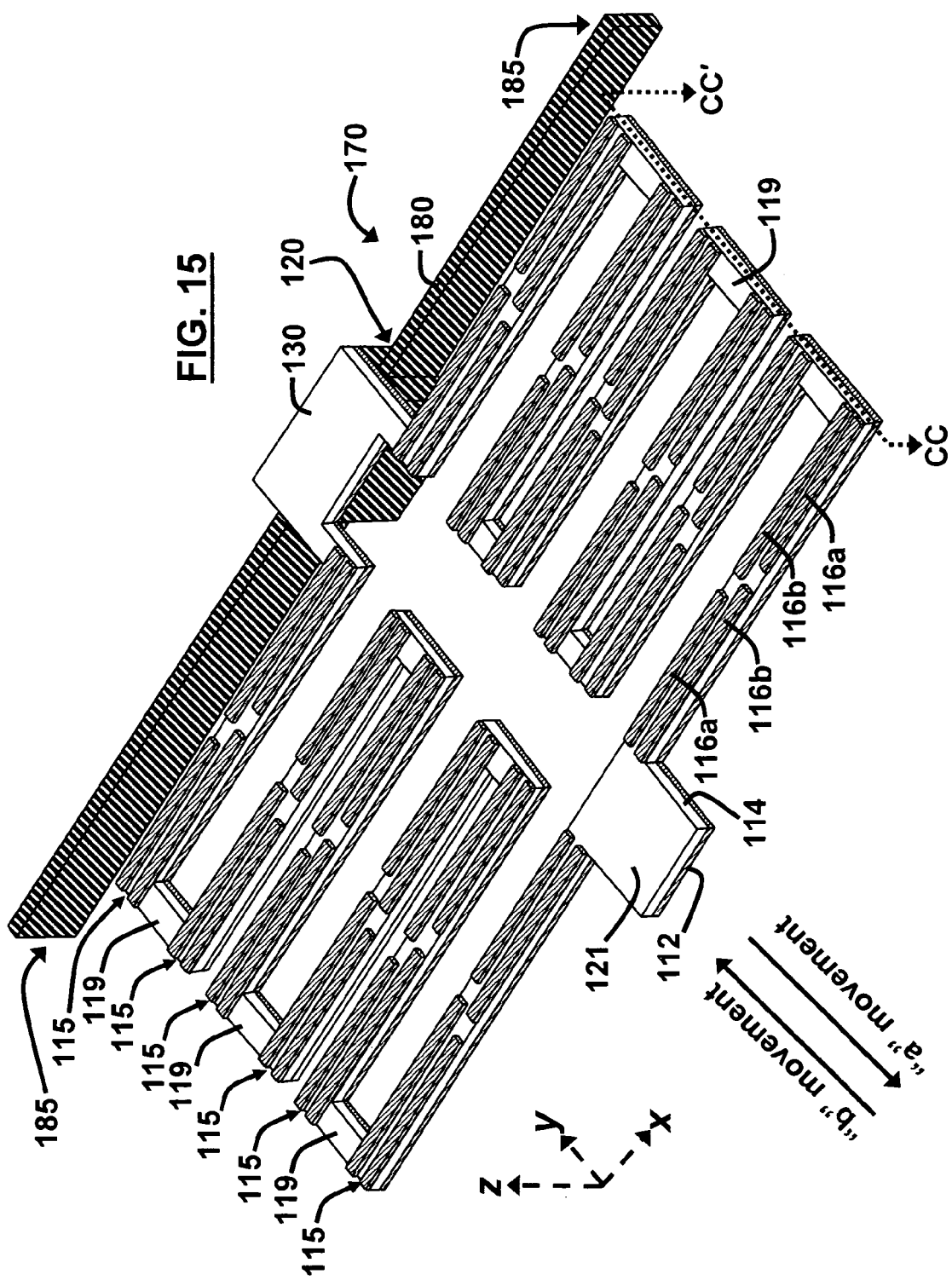
FIG. 15 is a top perspective view of a piezoelectric MEMS actuator/sensor device according to a fourth embodiment of the invention.

As illustrated in FIG. 15, the upper electrodes 116a, 116b are arranged in a similar pattern as in the second and third embodiments such that the upper electrode is configured for either extensional or contraction actuation. The anchored end 121 is attached to a substrate 118 (shown in FIG. 4) which fixes the actuator/sensor device 160 in place and the end effector 130 is positioned opposite the anchored end 121. The end effector 130 is positioned on the free end 120 of the piezoelectric MEMS actuator/sensor device 160. The displacement of the free end 120 remains in the x-y plane (plane of the substrate 118) upon actuation (i.e., application of voltage). FIG. 15 also illustrates the general bidirectional actuation of the upper electrodes 116a, 116b where the "a" movement corresponds with the direction of movement of upper electrode 116a and the "b" movement corresponds with the direction of movement of upper electrode 116b. Generally, the actuation of upper electrode 116a results in extension of the actuator/sensor device 170 and actuation of upper electrode 116b results in contraction of the actuator/sensor device 170.

The actuation occurs similarly to the process described for the actuator/sensor device 140 of FIGS. 5 and 6, the actuator/sensor device 150 of FIGS. 7 through 11(B), and the actuator/sensor device 160 of FIGS. 12 through 14(B), thus a voltage applied between the lower electrode 112 and one of the upper electrodes (shown here, for example, upper electrode 116b) causes in-plane (x-y plane) deflection of the actuator/sensor device 170 with the direction of the generated displacement shown as "a" and "b" for the respective upper electrodes 116a, 116b. Likewise, the converse effect is true for the structure to function as a sensor. An applied stress, causing bending, will cause the piezoelectric material to generate a voltage which may be detected with additional electronics (not shown).

Generally, the actuator/sensor device 170 comprises multiple (n) sets of parallel actuation beams 115 connected at their extreme ends by perpendicular connection beams 119. Electrode traces 113 (similar to the ones shown in FIGS. 9 and 10) also run along the connection beams 119 to electrically connect all actuation beams 115. Each set of parallel actuation beams 115 may then be attached to the next set by additional connection beams 119 at the inner ends of the parallel actuation beams 115. For the optimal configuration, the upper electrodes 116a, 16b on each parallel actuation beam 115 are configured as illustrated in either FIG. 9 or 10 in order to achieve maximum lateral deflection. The end effector 130 is located at the connection point of the last set of parallel actuation beams 115.

Figure 16:
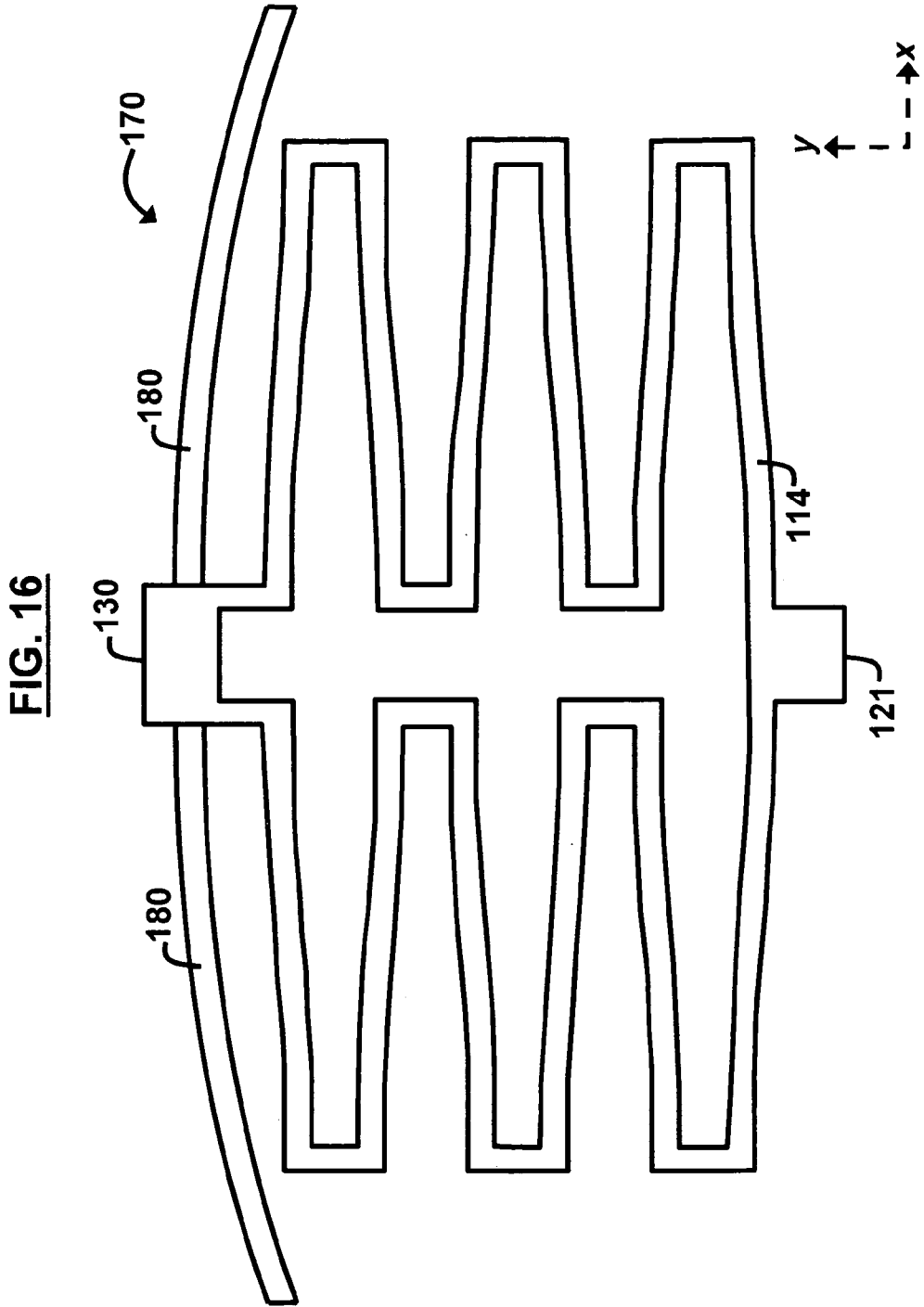
FIG. 16 is a top cross-sectional view of the piezoelectric MEMS actuator/sensor device of FIG. 15 undergoing extensional actuation according to a fourth embodiment of the invention.

FIG. 16 illustrates a top view of the actuator/sensor device 170 cut along line CC-CC' of FIG. 15 as it undergoes actuation thereby producing lateral in-plane (x-y plane) deflection of the actuator/sensor device 170. Thus, in the view shown in FIG. 16, the piezoelectric layer 114 is shown exposed. FIG. 16 illustrates the actuator/sensor device 170 undergoing extensional actuation with the electrode configuration depicted in FIG. 10 as well as deflection of the springs 180. Again, in the view shown in FIG. 16, the piezoelectric layer 114 is shown exposed, thus the upper electrodes 116a, 116b are not shown in this view.

Figure 17:
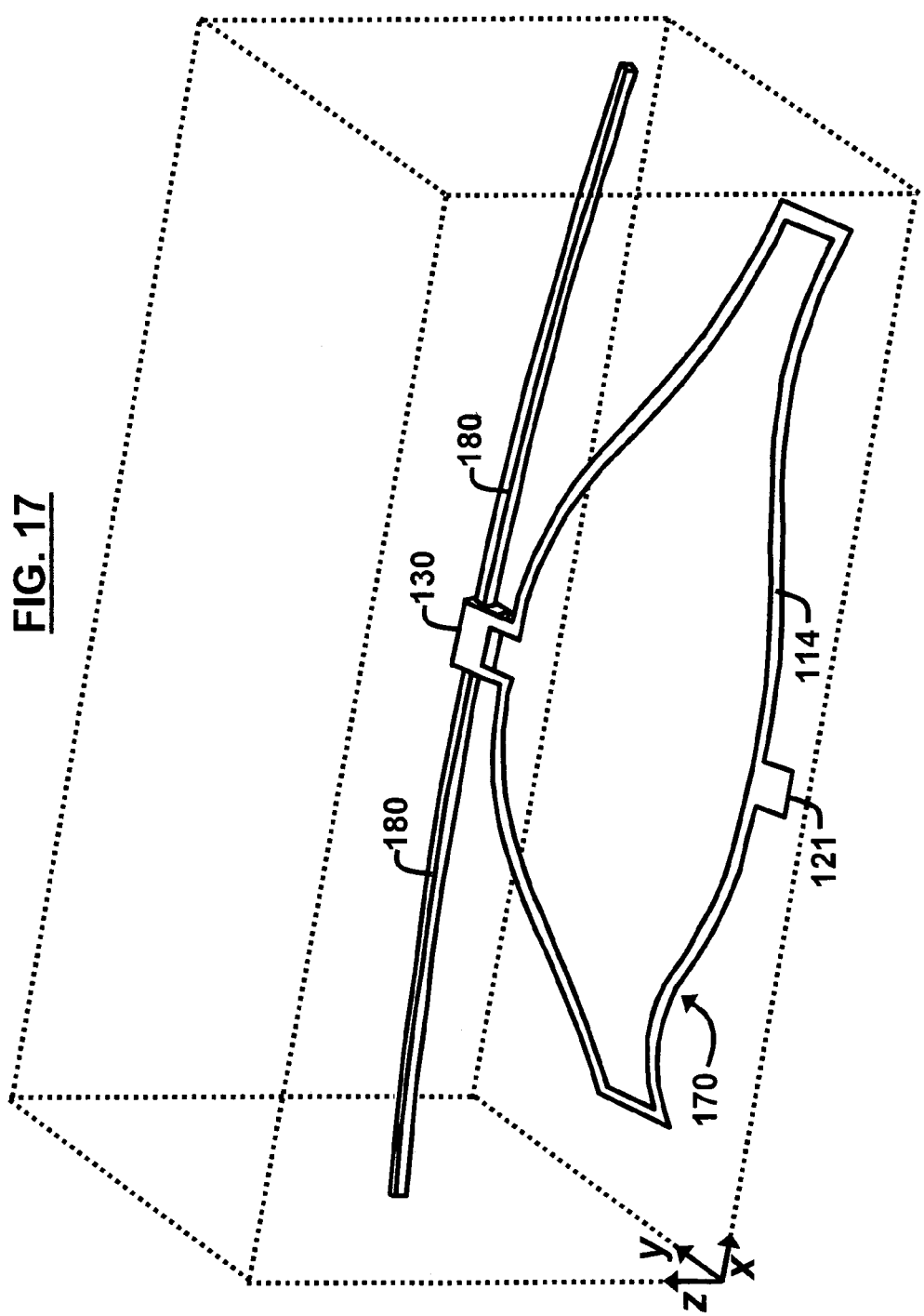
FIG. 17 is a top perspective view of the piezoelectric MEMS actuator/sensor device of FIG. 16 undergoing extensional actuation according to a fourth embodiment of the invention.
Figure 18:
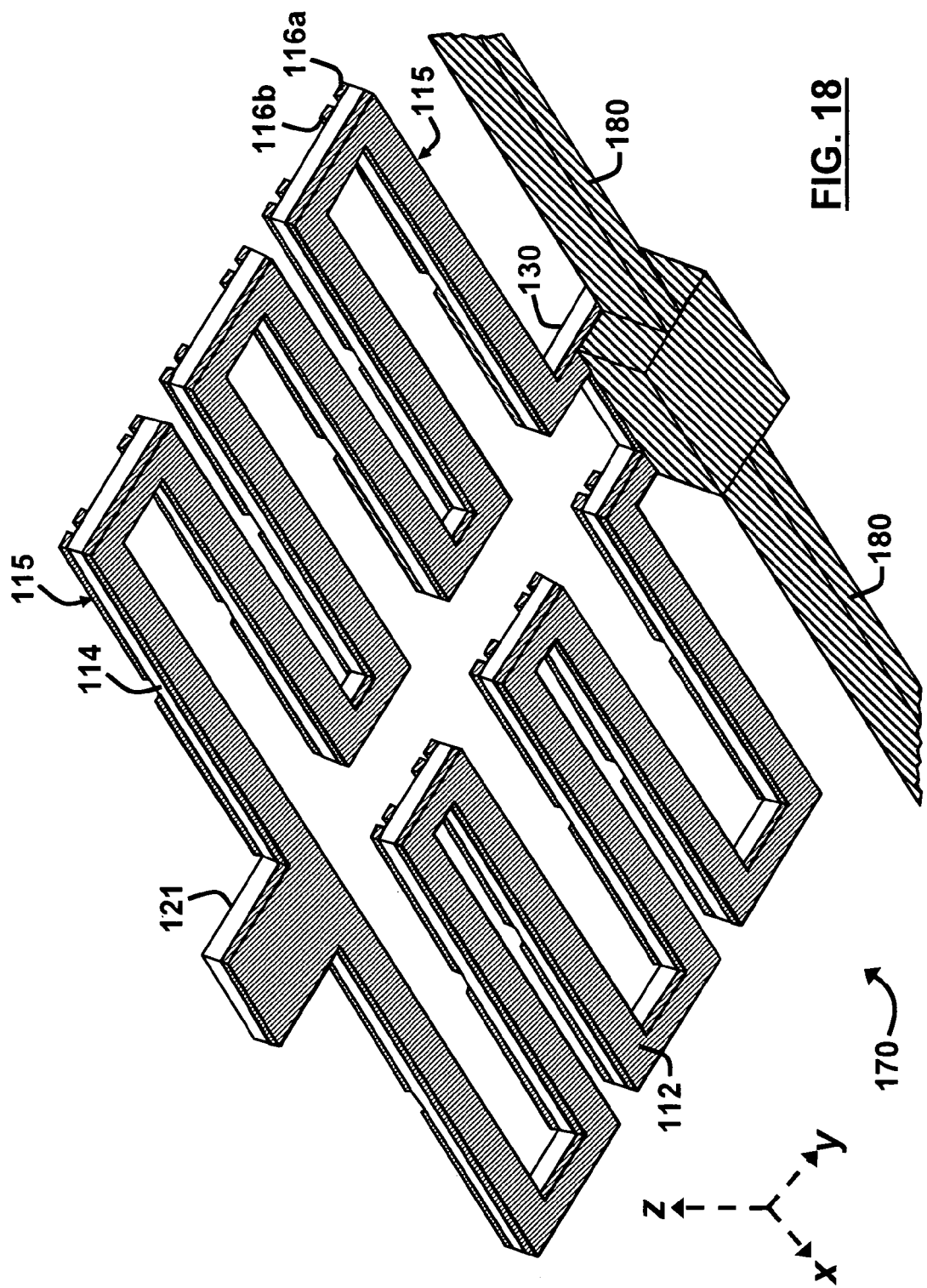
FIG. 18 is a bottom perspective view of the piezoelectric MEMS actuator/sensor device of FIG. 15 according to a fourth embodiment of the invention.

FIG. 17 illustrates a perspective view of the actuator/sensor device 170 showing the general in-plane deflection of the actuator/sensor device 170 with the stress deformation mitigation springs 180. Although the actuator/sensor device 170 deflects in the z-axis dimension (out-of-plane), the end effector 130 essentially remains in the x-y plane (in-plane deflection). Again, the displacement of the end effector 130 is what determines the characterization of in-plane actuation/deflection of the actuator/sensor device 170 versus out-of-plane actuation/deflection. The schematic of the actuator/sensor device 170 shown in FIG. 17 shows an overall approximation of the shape of the actuator/sensor device 170, and as such each individual actuation beam 115 of the actuator/sensor device 170 (of FIG. 15) is not illustrated in FIG. 17. FIG. 18 illustrates the bottom perspective view of the actuator/sensor device 170 of FIG. 12. In FIG. 18, the lower electrode 112 is shown as a continuous structure. Additionally, the thickness ratio between the springs 180 and the actuation beams 115 is shown. The greater thickness of the springs 180 compared to the actuation beams 115 is significant in that the generally thicker configuration of the springs 180 aids in achieving the large out-of-plane stiffness and its thin width and long length in the lateral (in-plane) dimensions provide the large in-plane compliance. These mechanical attributes prevent out-of-plane stress deformation with minimal reduction of the in-plane displacement of the end effector 130.

The various actuator/sensor devices 140, 150, 160, 170 provided by the several embodiments of the invention function such that the upper electrodes 116a, 116b are actuated asymmetrically with respect to the beam axis (x-axis) (i.e., x-z plane). For a structure that is symmetric (symmetry of mechanical properties and geometry) about the x-y midplane (neutral axis) of the piezoelectric layer 114, this results in a piezoelectrically induced bending moment arm ($\delta$) that lies in the x-y plane. The induced bending thus occurs in the x-y plane (i.e. the lateral direction).

The several embodiments of the invention allow for an entire new class of high performance MEMS, lateral (in the plane of the substrate 118) piezoelectric actuators. The applications for the embodiments of the invention are such that they could perform any function currently performed by lateral electrostatic MEMS actuators, the present standard, at significantly smaller sizes, power consumption, actuation voltages, and displacement ranges.

The actuator/sensor devices 140, 150, 160, 170 provided by the several embodiments of the invention permit extremely large displacements, on the order of hundreds to thousands of microns, at very low voltages. Some general applications include RF MEMS circuits, optical switching networks, safety and arming applications; and the embodiments of the invention may be an enabling technology for high performance micro-robotics. This class of devices may potentially revolutionize MEMS technology, displacing electrostatic MEMS as the dominant and most flexible MEMS technology.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A microelectromechanical system (MEMS) device comprising:

a substrate;

an anchored end connected to said substrate;

a free end positioned opposite to said anchored end;

a central gap separating said anchored end from said free end and positioned along a central longitudinal axis of said MEMS device; and multiple actuation beams each having a longitudinal axis positioned transverse to said central longitudinal axis of said central gap and said MEMS device, wherein said multiple actuation beams comprise a first set of multiple actuation beams and a second set of multiple actuation beams positioned on opposite sides of said central gap, wherein said central gap separates said first set of multiple actuation beams from said second set of multiple actuation beams, and wherein each actuation beam comprises:

a first electrode;

a piezoelectric layer over said first electrode; and multiple sets of second electrodes over said piezoelectric layer, wherein each of said sets of second electrodes being defined by a transverse gap there between, and wherein one of said sets of second electrodes are actuated asymmetrically with respect to a first plane resulting in a piezoelectrically induced bending moment arm in a lateral direction that lies in a second plane.

2. The device of claim 1, all the limitations of which are incorporated herein by reference, further comprising:

an end effector positioned at said free end and opposite to said anchored end; and a spring attached to said end effector, wherein said spring does not directly contact said multiple actuation beams.

3. The device of claim 1, all the limitations of which are incorporated herein by reference, further comprising:

multiple connection beams adapted to connect said multiple actuation beams to one another, wherein each connection beam is positioned substantially perpendicular to said multiple actuation beams, and wherein said each connection beam is positioned substantially parallel to said central gap.

4. The device of claim 3, all the limitations of which are incorporated herein by reference, wherein each of said multiple actuation beams comprise two sets of said second electrodes.

5. The device of claim 1, all the limitations of which are incorporated herein by reference, wherein said set of second electrodes comprise an extensional electrode and a contraction electrode.

6. The device of claim 2, all the limitations of which are incorporated herein by reference, wherein said spring comprises a residual stress deformation mitigation spring adapted to prevent out-of-plane stress deformation of said each actuation beam.

7. The device of claim 2, all the limitations of which are incorporated herein by reference, wherein said spring comprises a residual stress deformation mitigation spring adapted to restrict translational motion of said end effector to be within said second plane, and wherein said first plane is transverse to said second plane.

8. A microelectromechanical system (MEMS) device comprising:
at least one actuation beam comprising:
a continuous lower electrode;
a piezoelectric layer over said lower electrode; and
at least one pair of upper electrodes over said piezoelectric layer;
an anchored end connected to said actuation beam;
a free end opposite to said anchored end, wherein said free end comprises an end effector; and
a spring member connected to said free end, wherein said spring member does not directly contact said at least one actuation beam, and wherein said spring member flanks lateral sides of said end effector.

9. The device of claim 8, all the limitations of which are incorporated herein by reference, further comprising connection beams adapted to connect multiple actuation beams to one another, wherein each connection beam is positioned substantially perpendicular to said multiple actuation beams.

10. The device of claim 8, all the limitations of which are incorporated herein by reference, wherein said actuation beam comprises multiple pairs of said upper electrodes.

11. The device of claim 8, all the limitations of which are incorporated herein by reference, wherein said pair of upper electrodes comprises a first electrode and a second electrode, and wherein said pair of upper electrodes comprising a gap between said first electrode and said second electrode.

12. The device of claim 8, all the limitations of which are incorporated herein by reference, wherein said pair of upper electrodes comprise an extensional electrode and a contraction electrode.

13. The device of claim 8, all the limitations of which are incorporated herein by reference, wherein said spring member comprises a residual stress deformation mitigation spring adapted to prevent out-of-plane stress deformation of said actuation beam.

14. The device of claim 10, all the limitations of which are incorporated herein by reference, wherein one of said multiple pairs of upper electrodes are actuated asymmetrically with respect to a first plane resulting in a piezoelectrically induced bending moment arm in a lateral direction that lies in a second plane.

15. The device of claim 14, all the limitations of which are incorporated herein by reference, wherein said spring member comprises a residual stress deformation mitigation spring adapted to restrict translational motion of said end effector to be within said second plane, and wherein said first plane is transverse to said second plane.

16. The device of claim 8, all the limitations of which are incorporated herein by reference, further comprising a silicon substrate attached to said anchored end.

17. A microelectromechanical system (MEMS) device having a first end and a second end, said device comprising:
a sensor positioned in between said first end and said second end and comprising:
a piezoelectric layer; and
multiple electrodes sandwiching said piezoelectric layer, said multiple electrodes comprising a continuous first electrode attached to a first side of said piezoelectric layer and at least one pair of second electrodes attached to a second side of said piezoelectric layer, wherein said pair of second electrodes comprises a primary electrode and a secondary electrode defined by a transverse gap therebetween;
a substrate anchored to said first end;
an end effector attached to said second end; and
a spring member attached to lateral sides of said end effector and spaced apart from said sensor,
wherein said multiple electrodes are adapted to receive voltage, said voltage causing said end effector to laterally deflect in a geometric plane of said substrate.

18. The device of claim 17, all the limitations of which are incorporated herein by reference, further comprising:
multiple actuation beams; and
multiple connection beams adapted to connect said multiple actuation beams to one another,
wherein each of said multiple actuation beams comprise two pairs of said second electrodes.

19. The device of claim 17, all the limitations of which are incorporated herein by reference, wherein said primary electrode is an extensional electrode and said secondary electrode is a contraction electrode.

20. The device of claim 17, all the limitations of which are incorporated herein by reference, wherein said spring member comprises a residual stress deformation mitigation spring adapted to prevent out-of-plane stress deformation of said device.

21. The device of claim 17, all the limitations of which are incorporated herein by reference, wherein one of said pairs of second electrodes are actuated asymmetrically with respect to a first plane resulting in a piezoelectrically induced bending moment arm in a lateral direction that lies in a second plane.

22. The device of claim 21, all the limitations of which are incorporated herein by reference, wherein said spring member comprises a residual stress deformation mitigation spring adapted to restrict translational motion of said end effector to be within said second plane, and wherein said first plane is transverse to said second plane.

* * * * *